United States Patent
Hoff

(10) Patent No.: US 10,409,925 B1
(45) Date of Patent: Sep. 10, 2019

(54) METHOD FOR TUNING PHOTOVOLTAIC POWER GENERATION PLANT FORECASTING WITH THE AID OF A DIGITAL COMPUTER

(71) Applicant: Clean Power Research, L.L.C., Napa, CA (US)

(72) Inventor: Thomas E. Hoff, Napa, CA (US)

(73) Assignee: Clean Power Research, L.L.C., Napa, CA (US)

(*) Notice: Subject to any disclaimer, the term of this patent is extended or adjusted under 35 U.S.C. 154(b) by 1112 days.

(21) Appl. No.: 13/677,175

(22) Filed: Nov. 14, 2012

Related U.S. Application Data

(60) Provisional application No. 61/715,220, filed on Oct. 17, 2012.

(51) Int. Cl.
*G06F 17/50* (2006.01)
*H02S 50/00* (2014.01)

(52) U.S. Cl.
CPC .......... *G06F 17/5009* (2013.01); *H02S 50/00* (2013.01); *Y02E 60/76* (2013.01)

(58) Field of Classification Search
CPC ............... Y04S 40/22; Y04S 10/542; G01J 2001/4266; G01W 1/02; Y02E 60/76; H02S 50/00
See application file for complete search history.

(56) References Cited

U.S. PATENT DOCUMENTS 4,089,143 A 5/1978 La Pietra
4,992,942 A * 2/1991 Bauerle .................. A01G 31/00
                                                       700/284

(Continued)

OTHER PUBLICATIONS

Daniel S. Shugar, "Photovoltaics in the Utility Distribution System: The Evaluation of System and Distributed Benefits," 1990, Pacific Gas and Electric Company Department of Research and Development, p. 836-843.

(Continued)

*Primary Examiner* — Janet L Suglo
*Assistant Examiner* — Liam R Casey
(74) *Attorney, Agent, or Firm* — Patrick J. S. Inouye; Leonid Kisselev

(57) ABSTRACT

A computer-implemented system and method for tuning photovoltaic power generation plant forecasting is provided. Global horizontal irradiance (GHI), ambient temperature and wind speed for a photovoltaic power generation plant over a forecast period are obtained. Simulated plane-of-array (POA) irradiance is generated from the GHI and the plant's photovoltaic array configuration as a series of simulated observations. Inaccuracies in GHI conversion are identified and the simulated POA irradiance at each simulated observation is corrected as a function of the conversion inaccuracies. Simulated module temperature is generated based on the simulated POA irradiance, ambient temperature and wind speed. Simulated power generation over the forecast period is generated based on the simulated POA irradiance, simulated module temperature and the plant's specifications and status. Inaccuracies in photovoltaic power conversion are identified and the simulated power generation at each simulated input power level is corrected as a function of the power conversion inaccuracies.

18 Claims, 8 Drawing Sheets

(56) References Cited

U.S. PATENT DOCUMENTS

| | | | |
|---|---|---|---|
| 5,001,650 A | 3/1991 | Francis et al. | |
| 5,177,972 A | 1/1993 | Sillato et al. | |
| 5,602,760 A | 2/1997 | Chacon et al. | |
| 5,803,804 A | 9/1998 | Meier et al. | |
| 6,148,623 A | 11/2000 | Park et al. | |
| 6,366,889 B1 | 4/2002 | Zaloom | |
| 6,748,327 B1 | 6/2004 | Watson | |
| 7,742,892 B2 | 6/2010 | Herzig | |
| 8,155,900 B1 | 4/2012 | Adams | |
| 9,007,460 B2 | 1/2015 | Schmidt et al. | |
| 9,086,585 B2 | 7/2015 | Hamada et al. | |
| 9,103,719 B1* | 8/2015 | Ho | G01J 1/1626 |
| 2002/0055358 A1 | 5/2002 | Hebert | |
| 2005/0055137 A1 | 3/2005 | Andren et al. | |
| 2005/0222715 A1 | 10/2005 | Ruhnke et al. | |
| 2008/0258051 A1 | 10/2008 | Heredia et al. | |
| 2009/0125275 A1 | 5/2009 | Woro | |
| 2009/0302681 A1* | 12/2009 | Yamada | H02J 7/35 307/46 |
| 2010/0188413 A1* | 7/2010 | Hao | G06F 17/30572 345/589 |
| 2010/0198420 A1 | 8/2010 | Rettger et al. | |
| 2010/0211222 A1 | 8/2010 | Ghosn | |
| 2010/0219983 A1 | 9/2010 | Peleg et al. | |
| 2010/0309330 A1 | 12/2010 | Beck | |
| 2011/0137763 A1 | 6/2011 | Aguilar | |
| 2011/0272117 A1 | 11/2011 | Hamstra et al. | |
| 2011/0276269 A1 | 11/2011 | Hummel | |
| 2011/0307109 A1 | 12/2011 | Sri-Jayantha | |
| 2012/0078685 A1 | 3/2012 | Krebs et al. | |
| 2012/0130556 A1 | 5/2012 | Marhoefer | |
| 2012/0158350 A1 | 6/2012 | Steinberg et al. | |
| 2012/0191439 A1* | 7/2012 | Meagher | G06F 17/5009 703/18 |
| 2012/0310416 A1 | 12/2012 | Tepper et al. | |
| 2012/0330626 A1 | 12/2012 | An et al. | |
| 2013/0008224 A1 | 1/2013 | Stormbom | |
| 2013/0054662 A1* | 2/2013 | Coimbra | G06F 17/18 708/230 |
| 2013/0060471 A1 | 3/2013 | Aschheim et al. | |
| 2013/0152998 A1 | 6/2013 | Herzig | |
| 2013/0245847 A1 | 9/2013 | Steven et al. | |
| 2013/0262049 A1* | 10/2013 | Zhang | G06Q 50/06 703/2 |
| 2013/0274937 A1 | 10/2013 | Ahn et al. | |
| 2013/0289774 A1 | 10/2013 | Day et al. | |
| 2014/0039709 A1 | 2/2014 | Steven et al. | |
| 2014/0129197 A1 | 5/2014 | Sons et al. | |
| 2014/0214222 A1 | 7/2014 | Rouse et al. | |
| 2014/0222241 A1 | 8/2014 | Ols | |
| 2015/0088576 A1 | 3/2015 | Steven et al. | |
| 2015/0112497 A1 | 4/2015 | Steven et al. | |
| 2016/0187911 A1 | 6/2016 | Carty et al. | |

OTHER PUBLICATIONS

Andreas Schroeder, "Modeling Storage and Demand Management in Power Distribution Grids," 2011, Applied Energy 88, p. 4700-4712.

Francisco M. Gonzalez-Longatt et al., "Impact of Distributed Generation Over Power Losses on Distribution System," Oct. 2007, Electrical Power Quality and Utilization, 9th International Conference.

M. Begovic et al., "Impact of Renewable Distributed Generation on Power Systems," 2001, Proceedings of the 34th Hawaii International Conference on System Sciences, p. 1-10.

M. Thomson et al., "Impact of Widespread Photovoltaics Generation on Distribution Systems," Mar. 2007, IET Renew. Power Gener., vol. 1, No. 1 p. 33-40.

Varun et al., "LCA of Renewable Energy for Electricity Generation Systems—A Review," 2009, Renewable and Sustainable Energy Reviews 13, p. 1067-1073.

V.H. Mendez, et a., "Impact of Distributed Generation on Distribution Investment Deferral," 2006, Electrical Power and Energy Systems 28, p. 244-252.

Mudathir Funsho Akorede et al., "Distributed Energy Resources and Benefits to the Environment," 2010, Renewable and Sustainable Energy Reviews 14, p. 724-734.

Pathomthat Chiradeja et al., "An Approaching to Quantify the Technical Benefits of Distributed Generation," Dec. 2004, IEEE Transactions on Energy Conversation, vol. 19, No. 4, p. 764-773.

Shahab Poshtkouhi et al., "A General Approach for Quantifying the Benefit of Distributed Power Electronics for Fine Grained MPPT in Photovoltaic Applications Using 3-D Modeling," Nov. 20, 2012, IEE Transactions on Poweer Electronics, vol. 27, No. 11, p. 4656-4666.

Brinkman et al., "Toward a Solar-Powered Grid." IEEE Power & Energy, vol. 9, No. 3, May/Jun. 2011.

California ISO. Summary of Preliminary Results of 33% Renewable Integration Study—2010 CPUC LTPP. May 10, 2011.

Ellis et al., "Model Makers." IEEE Power & Energy, vol. 9, No. 3, May/Jun. 2011.

Danny at al., "Analysis of solar heat gain factors using sky clearness index and energy implications." Energy Conversions and Management, Aug. 2000.

Hoff et al., "Quantifying PV Power Output Variability." Solar Energy 84 (2010) 1782-1793, Oct. 2010.

Hoff et al., "PV Power Output Variability: Calculation of Correlation Coefficients Using Satellite Insolation Data." American Solar Energy Society Annual Conference Proceedings, Raleigh, NC, May 18, 2011.

Kuszamaul et al., "Lanai High-Density Irradiance Sensor Network for Characterizing Solar Resource Variability of MW-Scale PV System." 35th Photovoltaic Specialists Conference, Honolulu, HI. Jun. 20-25, 2010.

Serban C., "Estimating CLear SKy Solar Global Radiation Using Clearness Index, for Brasov Urban Area".

Mills et al., "Dark Shadows." IEEE Power & Energy, vol. 9, No. 3, May/Jun. 2011.

Mills et al., "Implications of Wide-Area Geographic Diversity for Short-Term Variability of Solar Power." Lawrence Berkeley National Laboratory Technical Report LBNL-3884E.

Perez et al., "Parameterization of site-specific short-term irradiance variability." Solar Energy, 85 (2011) 1343-1345, Nov. 2010.

Perez et al., "Short-term irradiance variability correlation as a function of distance." Solar Energy, Mar. 2011.

Philip, J., "The Probability Distribution of the Distance Between Two Random Points in a Box." www.math.kth.se/~johanph/habc.pdf. Dec. 2007.

Stein, J., "Simulation of 1-Minute Power Output from Utility-Scale Photovoltaic Generation Systems." American Solar Energy Society Annual Conference Proceedings, Raleigh, NC, May 18, 2011.

Solar Anywhere, 2011. Web-Based Service that Provides Hourly, Satellite-Derived Solar Irradiance Data Forecasted 7 days Ahead and Archival Data back to Jan. 1, 1998. www.SolarAnywhere.com.

Stokes et al., "The atmospheric radiation measurement (ARM) program: programmatic background and design of the cloud and radiation test bed." Bulletin of American Meteorological Society vol. 75, No. 7, pp. 1201-1221, Jul. 1994.

Hoff et al., "Modeling PV Fleet Output Variability," Solar Energy,May 2010.

Olopade at al., "Solar Radiation Characteristics and the performance of Photovoltaic (PV) Modules in a Tropical Station." Journal Sci. Res. Dev. vol. 11, 100-109, 2008/2009.

Li et al. "Analysis of solar heat gain factors using sky clearness index and energy implications." 2000.

Nguyen et al., "Estimating Potential Photovoltaic Yield With r.sun and the Open Source Geographical Resources Analysis Support System," Mar. 17, 2010, pp. 831-843.

Pless et al., "Procedure for Measuring and Reporting the Performance of Photovoltaic Systems in Buildings," 62 pages, Oct. 2005.

Emery et al., "Solar Cell Efficiency Measurements," Solar Cells, 17 (1986) 253-274.

Santamouris, "Energy Performance of Residential Buildings," James & James/Earchscan, Sterling, VA 2005.

(56) References Cited

OTHER PUBLICATIONS

Al-Homoud, "Computer-Aided Building Energy Analysis Techniques," Building & Environment 36 (2001) pp. 421-433.
Thomas Huld, "Estimating Solar Radiation and Photovoltaic System Performance," The PVGIS Approach, 2011 (printed Dec. 13, 2017).
Anderson et al., "Modelling the Heat Dynamics of a Building Using Stochastic Differential Equations," Energy and Building, vol. 31, 2000, pp. 13-24.

* cited by examiner

Data Collection Error

Fig. 11.
100

- Efficiency Curve
- Simulate power generation — 101
- Bin measured and simulated power generation — 102
- Evaluate ratio at each simulated input power level — 103
- Return

Fig. 12.
110

- Parasitic Losses
- Sum total nighttime power consumption — 111
- Divide by total number of nighttime service hours — 112
- Return

Fig. 10.
90

- Tune PV Power Gen
- Evaluate power conversion efficiency curve function — 91
- Adjust simulated power generation by value of power conversion efficiency curve function — 92
- Quantify average parasitic losses — 93
- Adjust simulated power generation by average parasitic losses — 94
- Correct for temperature — 95
- Adjust ambient temperature — 96
- Return

120

METHOD FOR TUNING PHOTOVOLTAIC POWER GENERATION PLANT FORECASTING WITH THE AID OF A DIGITAL COMPUTER

CROSS-REFERENCE TO RELATED APPLICATION

This non-provisional patent application claims priority under 35 U.S.C. § 119(e) to U.S. Provisional Patent Application, Ser. No. 61/715,220 filed Oct. 17, 2012, the disclosure of which is incorporated by reference.

FIELD

This application relates in general to photovoltaic power generation forecasting and, in particular, to a method for tuning photovoltaic power generation plant forecasting with the aid of a digital computer.

BACKGROUND

In recent years, the use of photovoltaic power generation systems both in the United States and abroad has progressively grown largely due to a continually increasing demand for renewable energy resources. This growth has been fed by advances in manufacturing of photovoltaic systems that have dramatically decreased the cost per watt of electricity generated. Government incentives have also further decreased per-watt costs. Photovoltaic systems are widely usable for standalone off-grid power, supplemental electricity sources and as power grid-connected systems. When integrated into a power grid, photovoltaic systems are collectively operated as a fleet of individual photovoltaic power generation plants, which may be deployed at different physical locations within a geographic region.

A modern electrical grid is a power generation, transmission and distribution infrastructure that delivers electrical power from suppliers to consumers often across a large geographically disbursed area. Power generation and consumption must be constantly balanced across an entire power grid, as electricity is consumed almost immediately upon production. Power failures within a power grid are of grave concern. A power failure in one part of a power grid could potentially cause electrical current to reroute from remaining power generators over transmission lines of insufficient capacity, thereby overloading transmission lines and short circuiting transformers with cascading power failures and widespread outages. As a result, both planners and operators must precisely determine real-time power generation and consumption throughout a power grid. They must also be able to accurately forecast power production from all sources, including photovoltaic systems, to meet expected power grid-wide demand.

Accurate power production data is particularly crucial when a photovoltaic fleet makes a significant contribution to a power grid's overall energy mix. At the individual photovoltaic plant level, power production forecasting first involves obtaining a prediction of solar irradiance derived from ground-based measurements, satellite imagery or numerical weather prediction models. The predicted solar irradiance is then combined with photovoltaic simulation models, which generates a forecast of individual plant power production. The individual forecasts can also combined into a photovoltaic power generation fleet forecast, such as described in commonly-assigned U.S. Pat. Nos. 8,165,811; 8,165,812; and 8,165,813, all issued to Hoff on Apr. 12, 2012, the disclosures of which are incorporated by reference, for use in power grid planning and operations.

Inaccuracies in a photovoltaic power generation forecast reduce the forecast's value to power grid planners and operators by discounting the degree to which they can rely on photovoltaic power to meet short term needs and by undermining their overall confidence in photovoltaic power as a reliable power source when compared to other power sources. Actual measured photovoltaic fleet power output can be compared to the simulated power output as predicted in a power forecast to help identify the magnitude of inaccuracy. Discrepancies between measured and simulated photovoltaic fleet power output are generally attributable to errors in the forecasted solar irradiance, the simulation models that combine photovoltaic system specifications with weather data to forecast individual photovoltaic plant production, or the models that combine the results from many photovoltaic plants to develop a photovoltaic fleet forecast.

Satellite imagery and numerical weather prediction models are commonly used to forecast the solar irradiance values that are provided as inputs into the photovoltaic simulation models and which are then determine forecast accuracy. Conventionally, simulation inaccuracies are addressed by dividing the photovoltaic power production forecasting into two, separate and unconnected processes. The first process produces the best possible weather data, with a particular emphasis on the best possible solar radiation data. The second process, which is treated independently of the first process, develops the most accurate photovoltaic simulation model possible; however, the simulation model assumes perfect weather data inputs.

This approach presents two shortcomings. First, the approach fails to recognize that perfect weather data is unavailable. There will always be inaccuracies in weather data, whether the result of calibration or other errors, such as in the case of ground-based data collection devices, or incorrect model translation, such as with solar irradiance data derived from satellite imagery or numerical weather prediction models. Second, the correct model calibration of a photovoltaic simulation model is dependent upon both the characteristics of the physical photovoltaic plant whose power production is being forecast and the irradiance data source and its inaccuracies. Tuning a photovoltaic plant to the most accurate weather data available and then using a different weather data source to actually forecast power production is suboptimal. The two processes need to be integrated into a unified photovoltaic forecasting methodology.

Therefore, a need remains for an approach to improving forecasts of the power output of a photovoltaic plant.

SUMMARY

A system and method for use in photovoltaic power generation plant forecasting begins by tuning irradiance data, such as derived from ground-based measurements, satellite imagery, numerical weather prediction models, or other solar irradiance forecasting methods. Photovoltaic power generation forecast accuracy is improved by performing a two-step tuning process: (1) integrated weather and photovoltaic plant performance tuning; and (2) operational plant status tuning, which more accurately forecasts the output of individual solar power plants and thus improves an overall photovoltaic fleet forecast. Integrated weather and photovoltaic plant performance tuning corrects for irradiance data and power conversion inaccuracies. Operational plant status tuning corrects for unpredictable photovoltaic plant performance and customer maintenance events.

One embodiment provides a computer-implemented system and method for tuning photovoltaic power generation plant forecasting. Global horizontal irradiance, ambient temperature and wind speed for a photovoltaic power generation plant over a forecast period are obtained. Simulated plane-of-array irradiance at the plant's location is generated from the global horizontal irradiance and the plant's photovoltaic array configuration as a series of simulated observations over the forecast period. Inaccuracies in conversion of the global horizontal irradiance are identified and the simulated plane-of-array irradiance at each simulated observation is corrected as a function of the conversion inaccuracies. Simulated module temperature is generated based on the simulated plane-of-array irradiance, ambient temperature and wind speed. Simulated power generation by the plant over the forecast period is generated based on the simulated plane-of-array irradiance, simulated module temperature and the plant's specifications and status. Inaccuracies in photovoltaic power conversion are identified and the simulated power generation at each simulated input power level is corrected as a function of the power conversion inaccuracies.

A further embodiment provides a computer-implemented system and method for tuning simulated plane-of-array irradiance for use in photovoltaic power generation plant forecasting. Global horizontal irradiance of a photovoltaic power generation plant over a forecast period is obtained. Simulated plane-of-array irradiance at the plant's location is generated from the global horizontal irradiance and the plant's photovoltaic array configuration as a series of simulated observations over the forecast period. An irradiance adjustment function is evaluated. Both measured irradiance and simulated irradiance are obtained. Global horizontal irradiance clear sky indexes, including normalized quantifications of sky clearness over the plant's location, is set. The measured irradiance and the simulated irradiance are correlated by respective times of measured and simulated observation over the forecast period. The correlated measured irradiance and the simulated irradiance are binned along a continuum of the global horizontal irradiance clear sky indexes. A ratio of the measured irradiance to the simulated irradiance at each global horizontal irradiance clear sky index is evaluated. The simulated plane-of-array irradiance at each simulated observation is adjusted by a value of the irradiance adjustment function that corresponds to the global horizontal irradiance clear sky index corresponding to the global horizontal irradiance used in generating the simulated plane-of-array irradiance at the simulated observation.

A still further embodiment provides a computer-implemented system and method for tuning power generation performance for use in photovoltaic power generation plant forecasting. Global horizontal irradiance, ambient temperature and wind speed for a photovoltaic power generation plant over a forecast period are obtained. Simulated plane-of-array irradiance at the plant's location is generated from the global horizontal irradiance and the plant's photovoltaic array configuration over the forecast period. Simulated module temperature is generated based on the simulated plane-of-array irradiance, ambient temperature and wind speed. Simulated power generation by the plant over the forecast period is generated based on the simulated plane-of-array irradiance, simulated module temperature and the plant's specifications and status. A power conversion efficiency curve function is evaluated. Measured power generation for the plant is obtained. The measured power generation and the simulated power generation are binned by simulated input power level. A ratio of the measured power generation to the simulated power generation at each simulated input power level is evaluated. The simulated power generation is adjusted by a value of the power conversion efficiency curve function that corresponds to each input power level, so as to minimize simulation error.

Still other embodiments will become readily apparent to those skilled in the art from the following detailed description, wherein are described embodiments by way of illustrating the best mode contemplated. As will be realized, other and different embodiments are possible and the embodiments' several details are capable of modifications in various obvious respects, all without departing from their spirit and the scope. Accordingly, the drawings and detailed description are to be regarded as illustrative in nature and not as restrictive.

BRIEF DESCRIPTION OF THE DRAWINGS

FIG. 10 is a flow diagram showing a routine for tuning simulated photovoltaic power generation for use in the method of FIG. 3.

FIG. 11 is a flow diagram showing a routine for evaluating a power conversion efficiency curve function for use in the routine of FIG. 10.

FIG. 12 is a flow diagram showing a routine for quantifying average parasitic losses for use in the routine of FIG. 10.

DETAILED DESCRIPTION

Photovoltaic Power Generation Estimation

Photovoltaic cells employ semiconductors exhibiting a photovoltaic effect to generate direct current electricity through conversion of solar irradiance. Within each photovoltaic cell, light photons excite electrons in the semiconductors to create a higher state of energy, which acts as a charge carrier for the electrical current. The direct current electricity is converted by power inverters into alternating current electricity, which is then output for use in a power grid or other destination consumer. A photovoltaic system uses one or more photovoltaic panels that are linked into an array to convert sunlight into electricity. A single photovoltaic plant can include one or more of these photovoltaic arrays. In turn, a collection of photovoltaic plants can be collectively operated as a photovoltaic fleet that is integrated into a power grid, although the constituent photovoltaic plants within the fleet may actually be deployed at different physical locations spread out over a geographic region.

Figure 1:
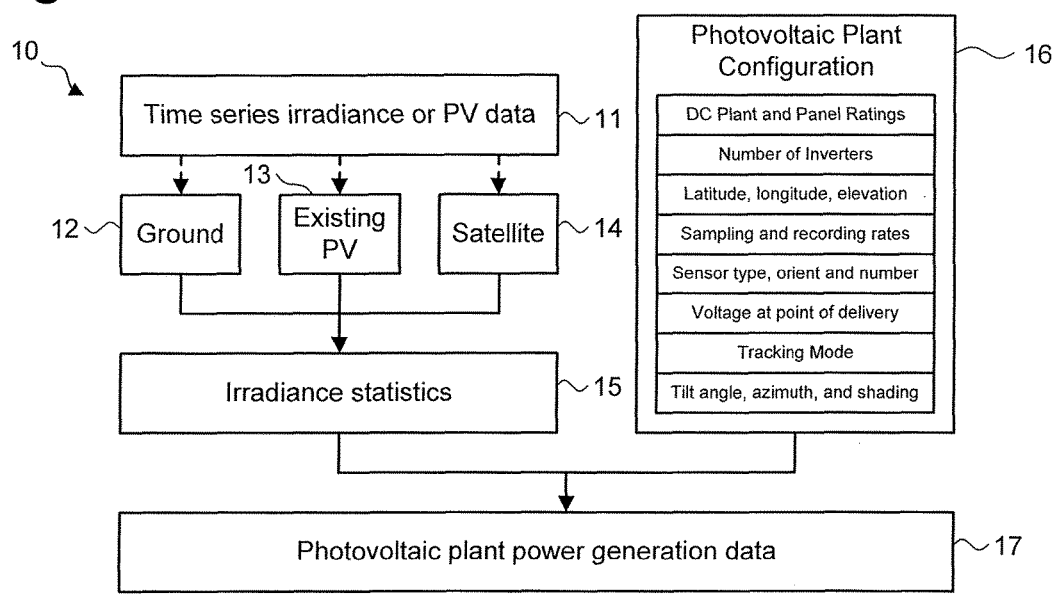
FIG. 1 is a process diagram showing, by way of example, a computer-implemented method for estimating power data for a photovoltaic power generation plant.

To aid with the planning and operation of power grids that rely on electricity generated by photovoltaic fleets, accurate forecasts of power production data for each of the individual photovoltaic plants within a fleet is essential to ensure that power grid demand and continuity are met. FIG. 1 is a process diagram showing, by way of example, a computer-implemented method 10 for estimating power data for a photovoltaic power generation plant. Power data is forecast based on weather and photovoltaic plant configuration data.

A time series of solar irradiance or photovoltaic ("PV") data is first obtained (step 11). Each time series contains solar irradiance observations measured or derived, then electronically recorded at a known sampling rate at fixed time intervals, such as at half-hour intervals, over successive observational time periods. The solar irradiance observations can include solar irradiance measured by a representative set of ground-based weather stations (step 12), existing photovoltaic systems (step 13), satellite observations (step 14), or some combination thereof. Other sources of the solar irradiance data are possible, including numeric weather prediction models.

Figure 6:
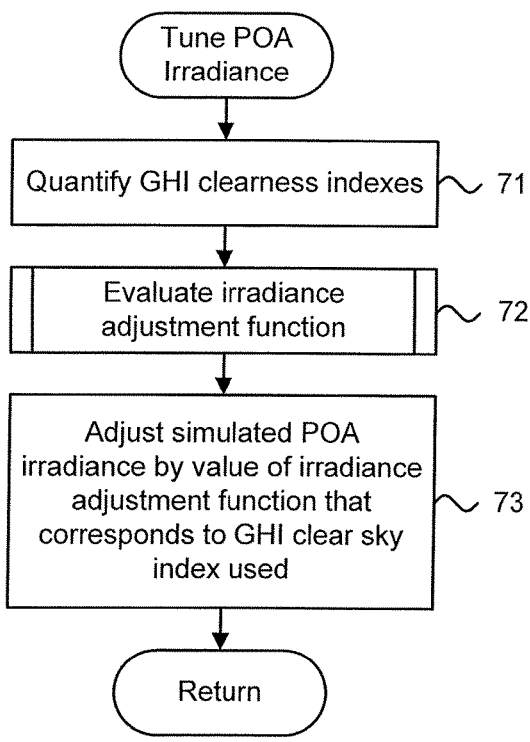
FIG. 6 is a flow diagram showing a routine for tuning simulated plane-of-array irradiance for use in the method of FIG. 3.

The solar irradiance data in the time series is converted over each of the time periods into a set of global horizontal irradiance clear sky indexes, which are calculated relative to clear sky global horizontal irradiance based on the type of solar irradiance data, as further described infra with reference to FIG. 6. The set of global horizontal irradiance clear sky indexes are interpreted into irradiance statistics (step 15), and power statistics, including a time series of the power statistics for the photovoltaic plant, are generated (step 17) as a function of the irradiance statistics and photovoltaic plant configuration (step 16). The photovoltaic plant configuration includes power generation and location information, including direct current ("DC") plant and photovoltaic panel ratings; number of power inverters; latitude, longitude and elevation; sampling and recording rates; sensor type, orientation, and number; voltage at point of delivery; tracking mode; and array tilt angle, azimuth and shading. Other types of information can also be included as part of the photovoltaic plant configuration. The resultant high-speed time series plant performance data can be combined to estimate photovoltaic fleet power output and variability, such as described in commonly-assigned U.S. Pat. Nos. 8,165,811; 8,165,812; and 8,165,813, cited supra, the disclosures of which are incorporated by reference, for use by power grid planners and operators, as well as other interested parties.

Forecast Tuning System Environment

Figure 2:
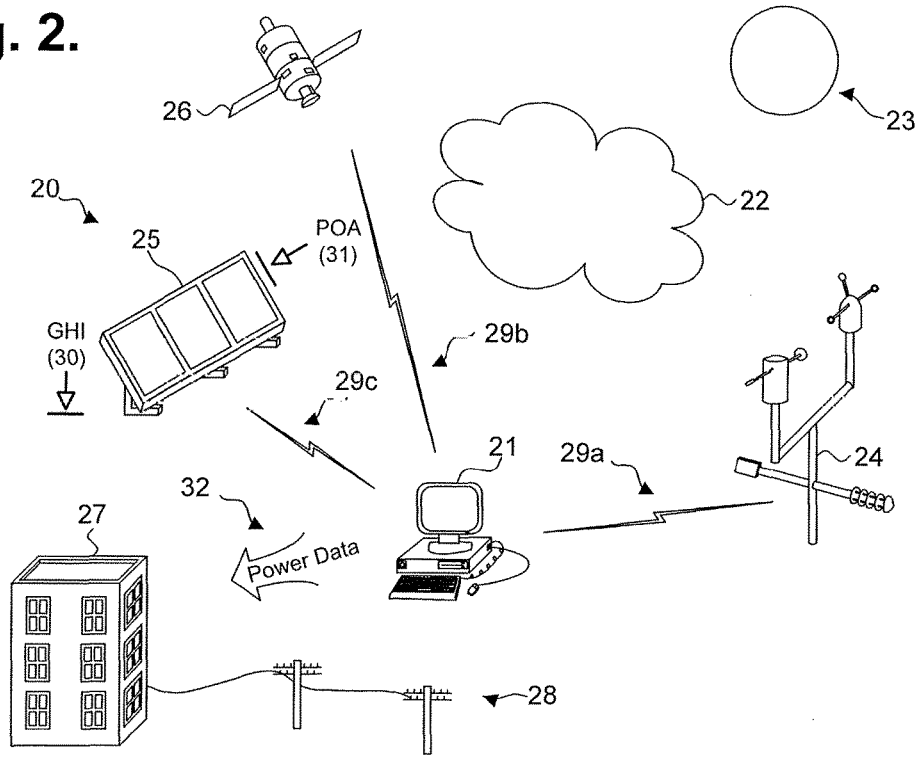
FIG. 2 is a functional block diagram showing a computer-implemented system for tuning photovoltaic power generation plant forecasting in accordance with one embodiment.

Each forecast of power production data for a photovoltaic plant predicts the expected power output over a forecast period. FIG. 2 is a functional block diagram showing a computer-implemented system 20 for tuning photovoltaic power generation plant forecasting in accordance with one embodiment. Time series power output data 32 for a photovoltaic plant is generated using observed field conditions relating to overhead sky clearness. Solar irradiance 23 relative to prevailing cloudy conditions 22 in a geographic region of interest is measured. Direct solar irradiance measurements can be collected by ground-based weather stations 24. Solar irradiance measurements can also be derived or inferred by the actual power output of existing photovoltaic systems 25. Additionally, satellite observations 26 can be obtained for the geographic region. In a further embodiment, the solar irradiance can be generated by numerical weather prediction models. Both the direct and inferred solar irradiance measurements are considered to be sets of point values that relate to a specific physical location, whereas satellite imagery data is considered to be a set of area values that need to be converted into point values, such as described in commonly-assigned U.S. Pat. No. 8,165,813, cited supra, the disclosure of which is incorporated by reference. Still other sources of solar irradiance measurements are possible.

The solar irradiance measurements are centrally collected by a computer system 21 or equivalent computational device. The computer system 21 executes the methodology described infra beginning with reference to FIG. 3 and as further detailed herein to generate forecast time series power data 32 and other analytics, which are then tuned through a two-step tuning process that includes: (1) integrated weather and photovoltaic plant performance tuning; and (2) operational plant status tuning. The tuning process uses irradiance and power data, both measured and simulated, to improve the power generation forecast of each photovoltaic plant and, in turn, the overall photovoltaic fleet forecast, which can be stored or provided 27 to power grid planners, operators, and other parties for use in solar power generation planning and operations. Integrated weather and photovoltaic plant performance tuning respectively correct inaccuracies in converting global horizontal irradiance ("GHI") 30 into plane-of-array ("POA") irradiance 31 and between simulated power 32 versus actual power 28 data conversion. Operational plant status tuning corrects for unpredictable photovoltaic plant performance and customer maintenance events.

The data feeds 29*a*-*c* from the sources of solar irradiance data 24, 25, 26 need not be high speed connections; rather, the solar irradiance measurements can be obtained at an input data collection rate extrapolated into an output time series at any time resolution, even faster than the input time resolution, such as described in commonly-assigned U.S. Pat. No. 8,165,813, cited supra, the disclosure of which is incorporated by reference. In addition, where the constituent photovoltaic plants are deployed at different physical locations within a geographic region, the data feeds 29*a*-*c* from one location can be correlated to provide simulated data feeds 29*a*-*c* at another location for use in power generation forecasting, such as described in commonly-assigned U.S. Pat. No. 8,165,811, cited supra, the disclosure of which is incorporated by reference.

The computer system 21 includes hardware components conventionally found in a general purpose programmable computing device, such as a central processing unit, memory, user interfacing means, such as a keyboard, mouse, and display, input/output ports, network interface, and non-volatile storage, and execute software programs structured into routines, functions, and modules for execution on the various systems. In addition, other configurations of computational resources, whether provided as a dedicated system or arranged in client-server or peer-to-peer topologies, and including unitary or distributed processing, communications, storage, and user interfacing, are possible.

Forecast Tuning Methodology

Figure 3:
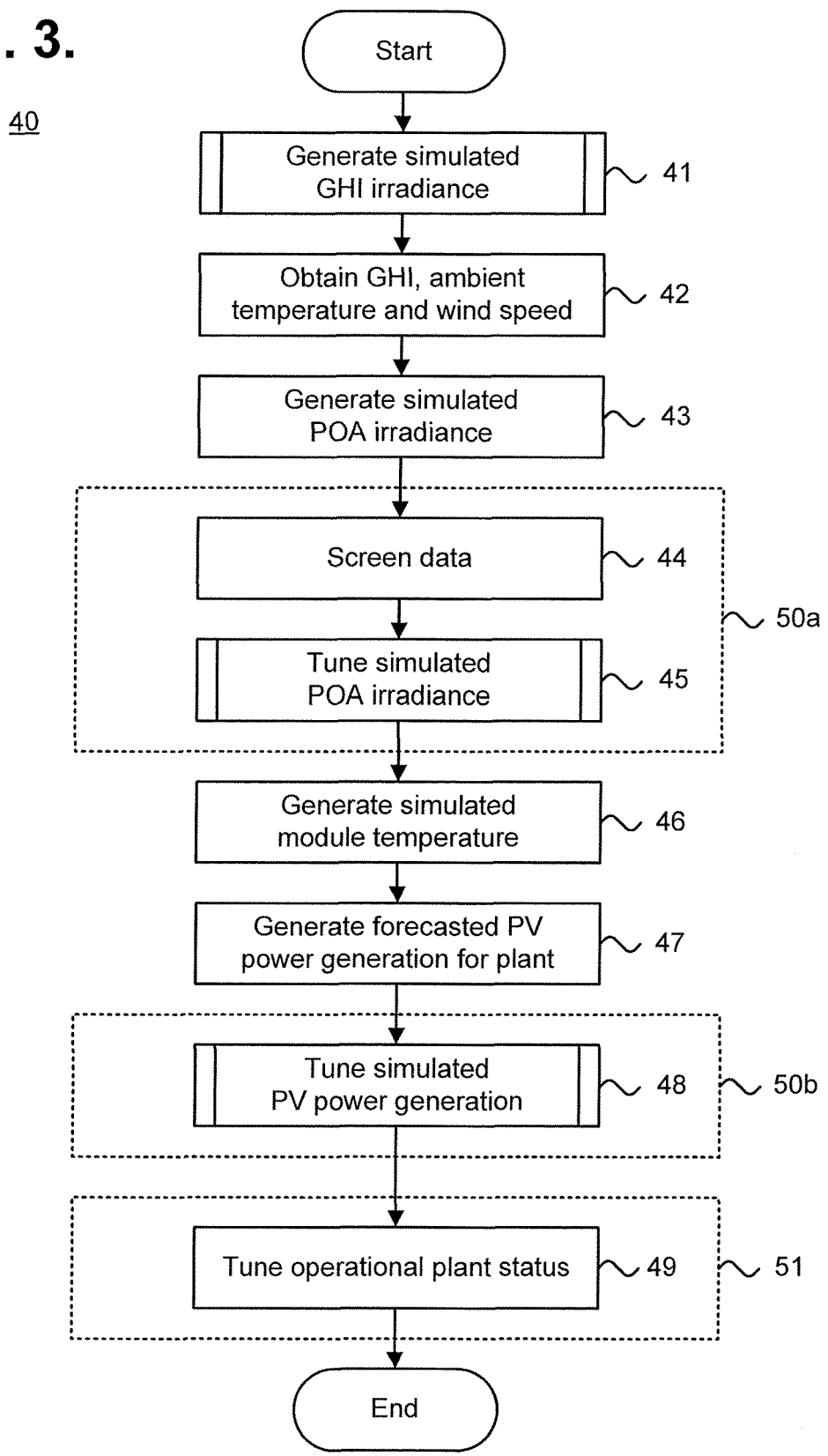
FIG. 3 is a flow diagram showing a computer-implemented method for tuning photovoltaic power generation plant forecasting in accordance with one embodiment.

Power generation forecasting is performed on a per-photovoltaic plant basis and includes a two-step tuning process to respectively correct irradiance data and power conversion inaccuracies, and adjust for unpredictable photovoltaic plant performance and customer maintenance events. FIG. 3 is a flow diagram showing a computer-implemented method 40 for tuning photovoltaic power generation plant forecasting in accordance with one embodiment. The method 40 can be implemented in software and execution of the software can be performed on a computer system, such as further described infra, as a series of process or method modules or steps.

Figure 5:
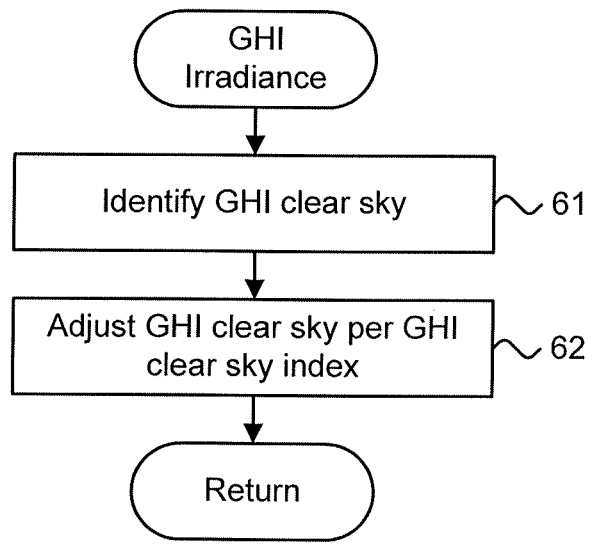
FIG. 5 is a flow diagram showing a routine for generating simulated global horizontal irradiance for use in the method of FIG. 3.

In the absence of tuning, photovoltaic plant power production forecasting begins with generating simulated global horizontal irradiance (step 41), as further described infra with reference to FIG. 5. The data for generating the simulated global horizontal irradiance 30 can be obtained from measurement devices located on the ground, satellite imagery, numerical weather prediction models, or some other source.

The simulated global horizontal irradiance 30 for the photovoltaic plant being modeled is obtained for use in the simulation methodology, as well as ambient temperature and wind speed data (step 42). Plane-of-array irradiance 31 is then simulated (step 43) using the simulated global horizontal irradiance 30 and photovoltaic plant configuration 16 (shown in FIG. 1), including tracking mode, array tilt angle, azimuth, and shading, as inputs, as further described infra with reference to FIG. 5. Simulated module temperature is then generated (steps 46) using the simulated plane-of-array irradiance, ambient temperature and wind speed as inputs. Finally, forecasted photovoltaic power generation for the plant is generated (step 47) using the simulated plane-of-array irradiance, simulated module temperature, photovoltaic plant configuration 16, and plant status as inputs.

Tuning improves the accuracy of the forecast by correcting the underlying input data based on dynamically observable factors, such as actual power output. The forecasted photovoltaic power generation is tuned through a two-step process (steps 50*a-b* and 51) that correct inaccuracies in the data used as inputs in successive steps of the power generation simulation. During the first step of the tuning process (steps 50*a-b*), integrated weather and photovoltaic plant performance tuning corrects for irradiance data and power conversion inaccuracies. Tuning the weather data and photovoltaic simulation model is performed as an integrated process.

Figure 4:
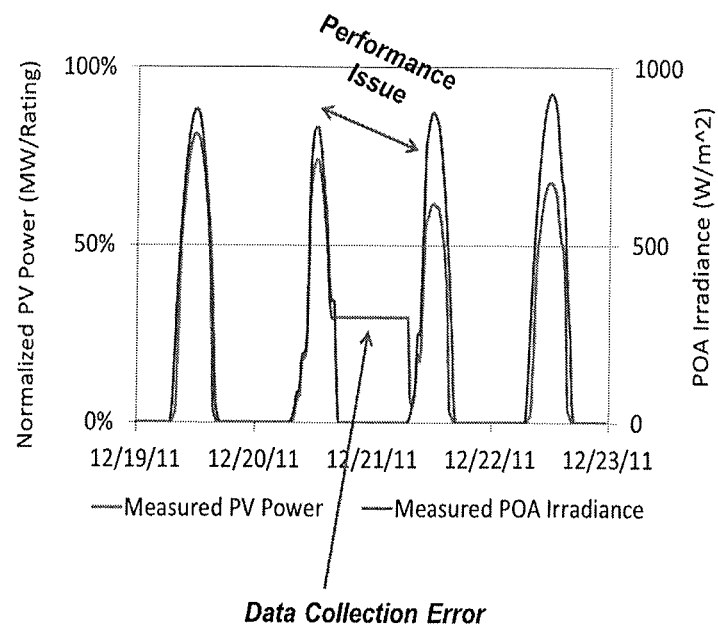
FIG. 4 is a graph depicting, by way of example, a data collection error and a photovoltaic system performance issue.

Tuning the weather data and photovoltaic simulation model can be further broken down into three substeps. In the first substep, the input data is screened (step 44) to eliminate data collection errors and identify photovoltaic plant performance issues. FIG. 4 is a graph depicting, by way of example, a data collection error and a photovoltaic system performance issue. Erroneous data collection errors can be identified by comparing measured photovoltaic power to measured plane-of-array irradiance. For instance, on Dec. 21, 2011, photovoltaic power was measured at about 25% of normalized photovoltaic power, yet the data indicates power generated during the night time, which is improbable for a solar plant whose fuel source is the sun. Photovoltaic system performance issues can be identified by comparing the normalized photovoltaic power production with the plane-of-array irradiance. For example, the peak measured plane-of-array irradiance during the period spanning Dec. 20-22, 2011 remains nearly constant at about 90%, yet the measured photovoltaic power dropped from around 75% between Dec. 20-21, 2011 to around 60% between Dec. 21-22, 2011, which indicates that photovoltaic plant performance decreased by an appreciable amount over a one-day period. Referring back to FIG. 3, both types of data are excluded during the remaining substeps, that is, integrated weather tuning (step 45) and photovoltaic plant performance tuning (48) to correctly calibrate the simulation model, assuming that the photovoltaic plant is working correctly. Only erroneous data, however, are excluded during the second step of the tuning process, that is, operational plant status tuning (step 49), as photovoltaic plant performance issues need to be included to enable the simulation methodology to identify and chronicle operational concerns.

The global horizontal irradiance 30 is used as an input into the remaining forecasting steps, either directly or as the basis of other inputs. Without being corrected, inaccuracies in the global horizontal irradiance 30 will be propagated throughout the simulation methodology and ultimately integrated into the resultant power generation forecast. As a result, in the second substep, the simulated plane-of-array irradiance is tuned (step 45), as further described infra with reference to FIG. 6. Tuning the simulated plane-of-array irradiance recognizes that inaccuracies will always exist, no matter how high the quality of the source and helps compensate for the non-existence of perfect weather data.

Finally, in the third substep, the simulated photovoltaic power generation is tuned (step 48), as further described infra with reference to FIG. 10. The photovoltaic simulation model is tuned to the measured photovoltaic power using the adjusted plane-of-array irradiance data, other weather data, and photovoltaic plant specifications. Simulated photovoltaic power generation tuning calibrates the power conversion efficiency as a function of power level and parasitic (no load) losses.

During the second step of the tuning process (step 51), the operational plant status is tuned (step 49) to correct for unpredictable photovoltaic plant performance and customer maintenance events. Operational plant status tuning (step 51) is required because integrated weather and photovoltaic plant performance tuning (steps 50*a-b*) cannot exactly capture unpredictable events associated with photovoltaic performance and customer maintenance. For example, a power inverter outage is an unpredictable photovoltaic performance event, while photovoltaic panel washing after a long period of soiling is an example of an unpredictable customer maintenance event. Operational plant status tuning can be performed using only a limited amount of historical measured photovoltaic energy production and simulated data. Photovoltaic power production is forecasted using satellite or other forecasted irradiance data, and the simulation model is calibrated using results from integrated weather and photovoltaic plant performance tuning (steps 50*a-b*). Operational plant status tuning (step 51) makes an additional adjustment that corrects the simulated energy to match the measured energy for the fixed recent period, such as the previous two days, although other adjustment periods could be used, ranging from a few hours to several days.

Simulated Global Horizontal Irradiance

The global horizontal irradiance 30 is a critical input into the forecasting methodology. FIG. 5 is a flow diagram showing a routine 60 for generating simulated global horizontal irradiance for use in the method 40 of FIG. 3. Global horizontal irradiance 30 is produced in two steps. First, global horizontal irradiance clear sky (Watts/m$^2$) is identified (step 61), which is the maximum amount of solar radiation available on a horizontal surface at a specific moment in the observational time frame. Second step, the global horizontal irradiance clear sky is adjusted (step 62) to reflect the overhead sky clearness using a global horizontal irradiance clear sky index (Kt*), which is normalized between 0 and 1. The adjusted global horizontal irradiance clear sky becomes the simulated global horizontal irradiance 30.

Integrated Weather Tuning

Integrated weather tuning derives custom plane-of-array irradiance calibration parameters for each photovoltaic plant. The parameters correct for inaccuracies in irradiance translation. FIG. 6 is a flow diagram showing a routine 70 for tuning simulated plane-of-array irradiance for use in the method 40 of FIG. 3. Integrated weather tuning uses measured time series data, such as one-minute, half-hour, or hourly data, for a set time period, such as one year. Either global horizontal or plane-of-array irradiance, both measured and simulated, are required as inputs to integrated weather tuning.

Figure 7:
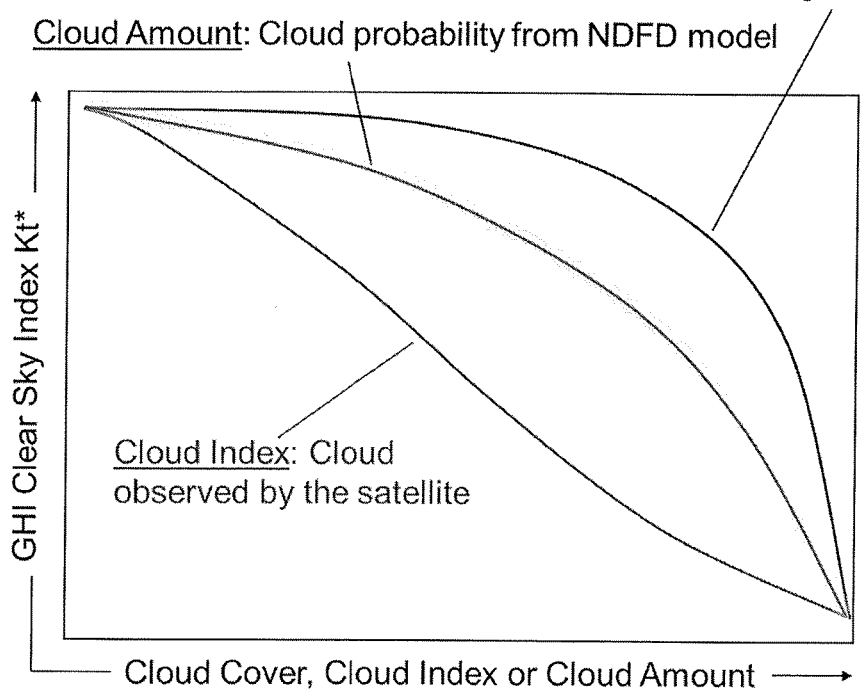
FIG. 7 is a graph depicting, by way of example, ground horizontal irradiance clear sky index conversion functions.

Initially, overhead sky clearness is quantified (step 71) as a set of global horizontal irradiance clearness indexes. FIG. 7 is a graph depicting, by way of example, ground horizontal irradiance clear sky index conversion functions. The x-axis represents the value of a source of the cloud data, whether cloud clover, cloud index or cloud amount. The y-axis represents the value of the global horizontal irradiance clear sky index Kt*, which corresponds to a particular cloud data value. Sky clearness at a particular point in time can be quantified as a global horizontal irradiance clear sky index Kt* through a function that depends upon the source of the cloud data. The graph presents functions to convert cloud cover, cloud index, or cloud amount to Kt*. These functions are dependent on the nature of the cloud index, whether the cloud index is observed or measured cloud cover at the ground (yellow line), the cloud index is seen from space (blue line), or the cloud amount is probabilistically generated by a numerical weather prediction model (red line).

Accuracy of the global horizontal irradiance 30 depends upon the ability of the underlying data source to accurately depict clouds, the accuracy of the conversion from cloud index (or cloud amount) to Kt*, and the accuracy of the global horizontal irradiance clear sky. The irradiance calibration adjusts the function that converts cloud cover or cloud index to Kt* (step 72), as described infra with reference to FIG. 8. The simulated plane-of-array data is then modified by this adjustment function based on the value of Kt* for that particular observation (step 73).

Irradiance Adjustment

Figure 8:
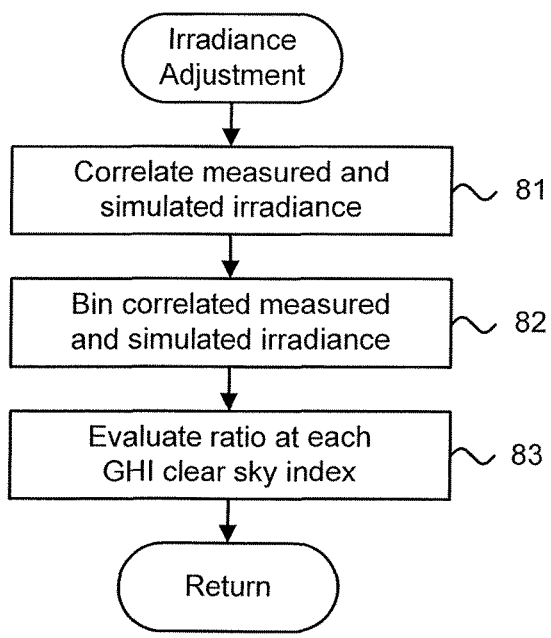
FIG. 8 is a flow diagram showing a routine for evaluating an irradiance adjustment function for use in the routine of FIG. 6.
Figure 9:
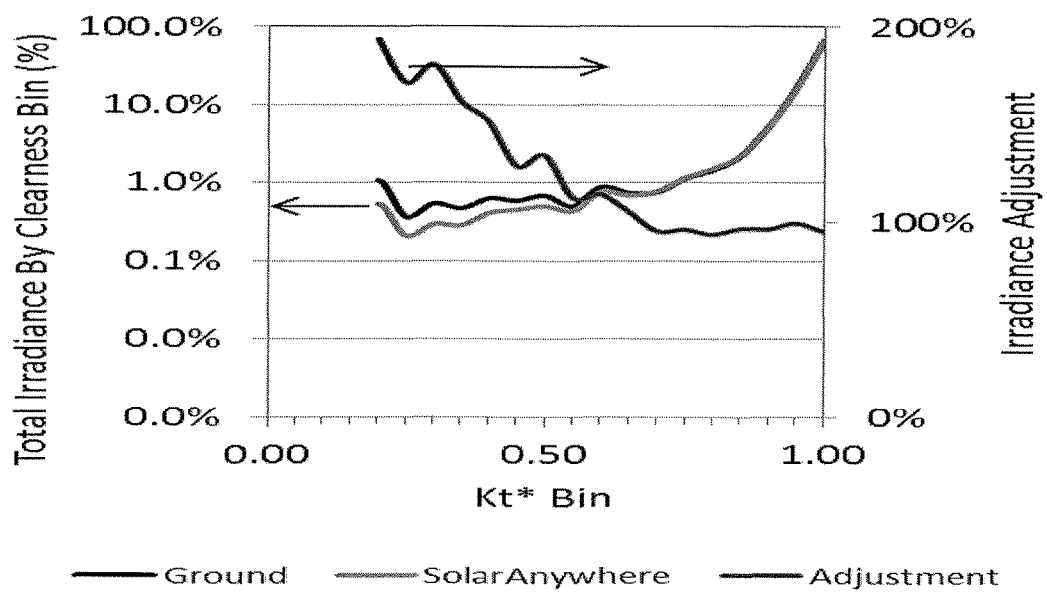
FIG. 9 is a graph depicting, by way of example, an irradiance adjustment function for a photovoltaic plant.

The irradiance calibration adjusts the function that converts cloud data to Kt*. FIG. 8 is a flow diagram showing a routine 80 for evaluating an irradiance adjustment function for use in the routine 70 of FIG. 6. The adjustment function is produced by first time correlating measured and simulated irradiance data (step 81), which can be global horizontal irradiance, if available, or else plane-of-array irradiance. The correlated measured and simulated irradiance is binned by their respective values of Kt* (step 82) (quantified using the simulated data, since only simulated data will be available when the simulation is performed. Finally, the ratio of the total measured irradiance to total simulated irradiance at each value of Kt* is evaluated (step 83) and an adjustment function is developed to minimize error between the measured and simulated irradiance. By way of example, FIG. 9 is a graph depicting an irradiance adjustment function for a photovoltaic plant.

Photovoltaic Plant Performance Tuning

Photovoltaic plant performance tuning derives custom photovoltaic simulation model parameters for each photovoltaic plant. The parameters correct for inaccuracies in power conversion efficiency. FIG. 10 is a flow diagram showing a routine 90 for tuning simulated photovoltaic power generation for use in the method 40 of FIG. 3. Photovoltaic plant performance tuning uses measured time series data, such as one-minute, half-hour, or hourly data, for a set time period, such as one year. Alternating current power outputs, both measured and simulated, are required as inputs to photovoltaic plant performance tuning.

There are three aspects of the photovoltaic simulation model tuning. First, the power conversion efficiency curve is specified as a function input power (step 91) as further described infra with reference to FIG. 11, and the simulated power generation is adjusted by the value of the resultant power conversion efficiency curve function (step 92). Second, parasitic losses are quantified (step 93), (step 91) as further described infra with reference to FIG. 12, and the simulated power generation is adjusted by the average parasitic losses (step 94). Finally, temperature is corrected (step 95), as further described infra with reference to FIG. 13, and the ambient temperature is then adjusted accordingly (step 96).

Power Conversion Efficiency Curve Function

Power efficiency reflects the overall ability of a photovoltaic plant to convert irradiance into power, and efficiency can be modeled as a function of simulated and actual power production. FIG. 11 is a flow diagram showing a routine 100 for evaluating a power conversion efficiency curve function for use in the routine 90 of FIG. 10. The power curve efficiency curve (conversion efficiency in percentage versus input power in MW) is developed by simulating power output (step 101) with all the steps, except the power conversion efficiency, binning measured and simulated power generation data (step 102) by simulated input power level, and evaluating the ratio of the total measured photovoltaic energy to the total simulated photovoltaic energy for each input power level (step 103), so as to minimize error.

Average Parasitic Loss

Parasitic losses represent the power consumed by a photovoltaic plant in the absence of a load. FIG. 12 is a flow diagram showing a routine 110 for quantifying average parasitic losses for use in the routine 90 of FIG. 10. Average parasitic losses (MW) are determined by summing the total nighttime power consumption (step 111) and dividing the result by the number of nighttime hours service hours (step 112).

Temperature Correction

Figure 13:
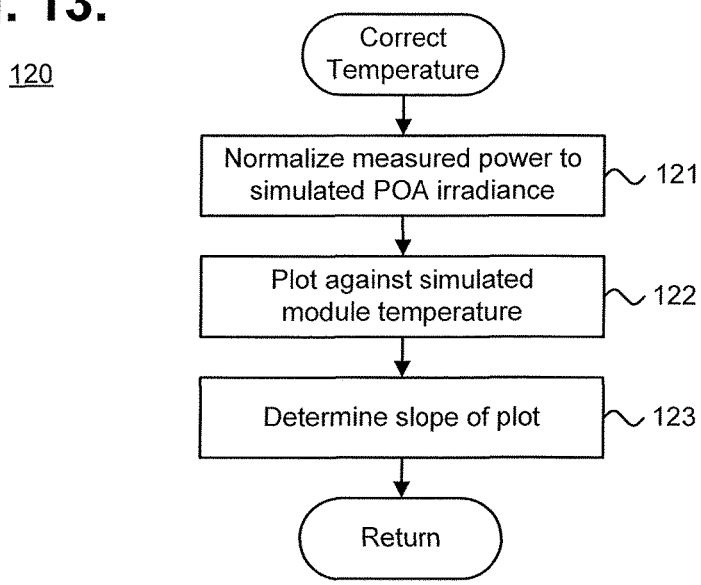
FIG. 13 is a flow diagram showing a routine for correcting for temperature for use in the routine of FIG. 10.

Ambient temperature can affect the efficiency of power conversion. FIG. 13 is a flow diagram showing a routine 120 for correcting for temperature for use in the routine 90 of FIG. 10. The temperature correction adjustment is determined by normalizing measured power production using plane-of-array irradiance 31 (step 121), plotting the normalized measured power production against the simulated module temperature (step 122), and finally determining the slope of the resultant equation (step 123).

Empirical Results

The two-step tuning process results in better power generation forecast accuracy. The forecasting error in a photovoltaic fleet can be approximated by dividing average individual photovoltaic plant error by the square root of the number of photovoltaic plants, given that photovoltaic plants are identically sized and independent, such as described in T. E. Hoff et al., "Quantifying PV Power Output Variability," *Solar Energy*, Vol. 84, pp. 1782-1793 (2010); and T. E. Hoff et al., "Modeling PV Fleet Output Variability," *Solar Energy*, Vol. 86, pp. 2177-2189 (2011), the disclosures of which are incorporated by reference.

Application to Individual Photovoltaic Plants

Suppose, for example, a 16% forecasting error associated with the individual photovoltaic plants in a photovoltaic fleet, with a goal of a 1% forecasting error for the photovoltaic fleet overall. Tuning, as described supra, can reduce the forecasting error from 16% to around 9%, which can be achieved with 81 photovoltaic plants when the average error is 9%, that is, $$\frac{9\%}{\sqrt{81}} = 1\% \quad {}^{9\%\frac{\square}{\sqrt{81}}=1\%}.$$

On the other hand, reducing the forecasting error to around nine percent requires 256 plants, or more than three times as many photovoltaic plants, when the average error is 16%, that is, $$\frac{16\%}{\sqrt{256}} = 1\%.$$

Results based on measured data from three photovoltaic plants indicate that the tuning methodology, as described supra, reduces inaccuracies by more than 40%, that is, from almost 16% to under 9%. The results of this approach were applied using one year of measured time series, half-hour, photovoltaic plant power production and irradiance data, both ground horizontal irradiance and plane-of-array irradiance, obtained for three locations in or near California, between Sep. 1, 2011 and Aug. 31, 2012. The simulated data were based on SolarAnywhere Enhanced Resolution data for the same time period and time interval, as available from Solar Anywhere, a Web-based service operated by Clean Power Research, LLC, Napa, Calif.

Figure 14:
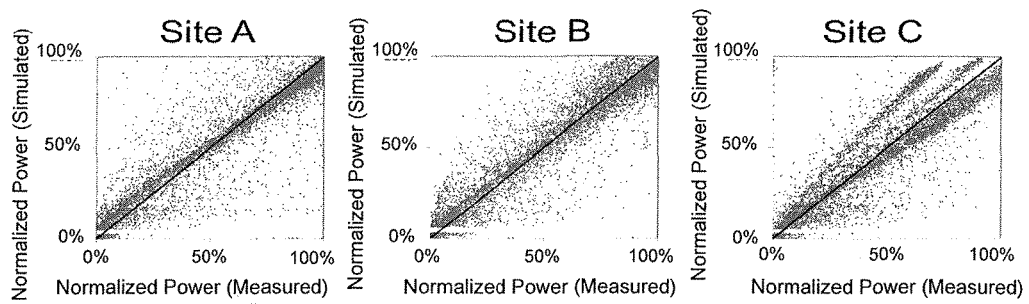
FIGS. 14 and 15 are graphs respectively depicting, by way of examples, simulated versus measured photovoltaic power production before and after tuning for three photovoltaic plant sites.
Figure 15:
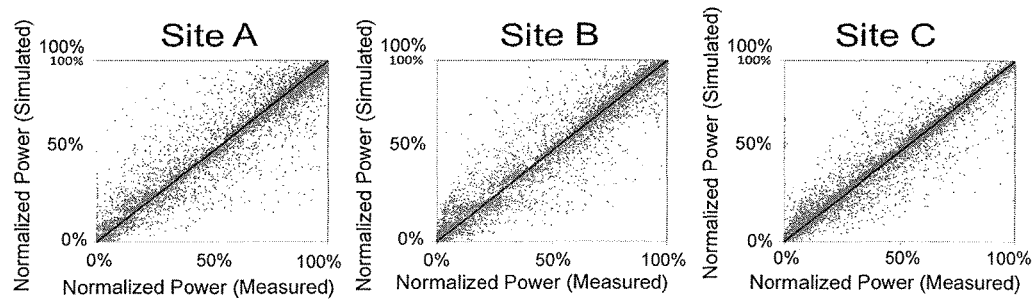

FIGS. 14 and 15 are graphs respectively depicting, by way of examples, simulated versus measured photovoltaic power production before and after tuning for three photovoltaic plant Sites A, B and C. FIG. 14 presents the simulated versus measured photovoltaic power production on a half-hour basis for a one-year period using only an annual power calibration. FIG. 15 presents the same results after applying the tuning methodology, as described supra. The simulation power generation data would perfectly match the measured power generation data if all of the blue simulation data points were on the red line. FIG. 14 suggests that the annual power calibration approach is inadequate when a photovoltaic plant has significant performance issues. Here, Site B suffers to some degree and Site C to a greater degree.

FIG. 14 also suggests that there is a need for improvement in the power conversion model, which is most clearly visible in the curvature of the set of blue points for Site A: more of the blue points are above the red line at low power, that is, the simulated results are too high, while more of the blue points are below the red line at high power, that is, the simulated results are too low. FIG. 15 indicates that the two tuning processes reduce the error associated with the irradiance and power conversion issues, as well as capture photovoltaic plant performance issues.

Figure 16:
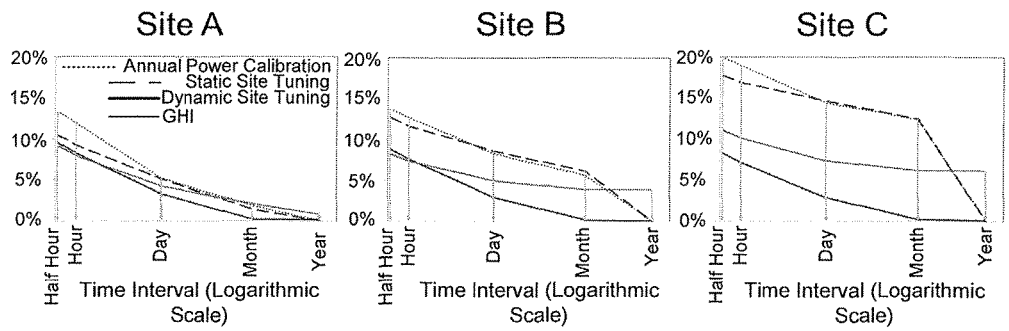
FIG. 16 are graphs depicting, by way of example, mean absolute errors of the simulated photovoltaic power production for the three photovoltaic plant sites of FIG. 15 following tuning.

FIG. 16 are graphs depicting, by way of example, mean absolute errors of the simulated photovoltaic power production for the three photovoltaic plant sites of FIG. 15 following tuning. Error analysis results are generated and graphed using the Mean Absolute Error (MAE) metric, such as described in T. E. Hoff et al., "Reporting of Irradiance Modeling Relative Prediction Errors," Prog. Photovolt: Res. Appl. doi: 10.1002/pip.2225 (2012), the disclosure of which is incorporated by reference. FIG. 16 suggests that the integrated weather and photovoltaic plant performance tuning realizes most of the benefit of accuracy improvements for a plant that functions well (Site A), but the operational plant status tuning is required for plants that experience performance issues (Sites B and C). The half-hour MAE averages less than 9% for each of the plants, respectively 9.6%, 8.8% and 8.3% percent for Sites A, B and C when both tuning approaches are applied.

Application to Photovoltaic Fleets

Figure 17:
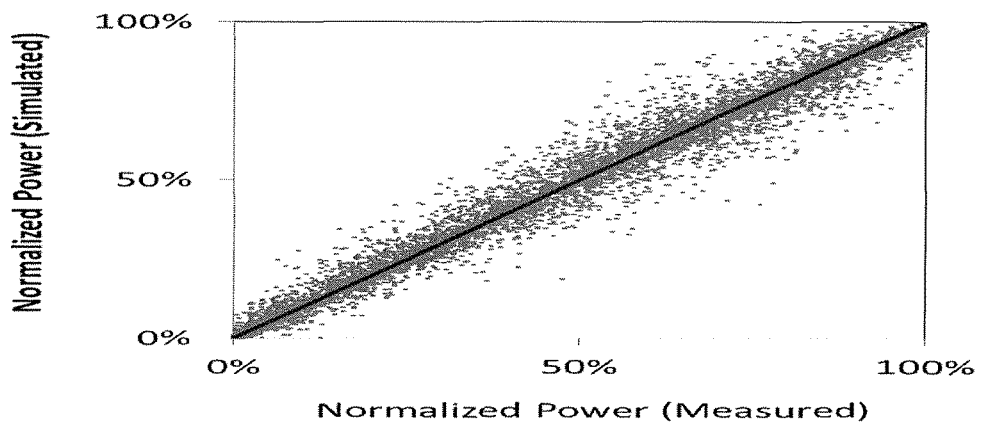
FIG. 17 is a graph depicting, by way of example, simulated versus measured photovoltaic power production before and after tuning for a photovoltaic fleet.
Figure 18:
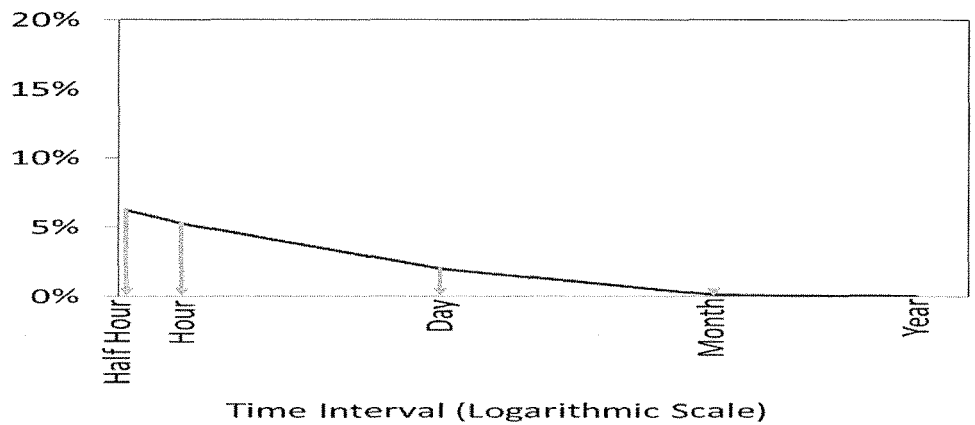
FIG. 18 is a graph depicting, by way of example, mean absolute error of the simulated photovoltaic power production for the photovoltaic fleet of FIG. 17 following tuning.

The previous analysis was applied to individual photovoltaic plants. FIG. 17 is a graph depicting, by way of example, simulated versus measured photovoltaic power production before and after tuning for a photovoltaic fleet, which applies the tuning methodology, as described supra, to a fleet of photovoltaic plants. FIG. 18 is a graph depicting, by way of example, mean absolute error of the simulated photovoltaic power production for the photovoltaic fleet of FIG. 17 following tuning. FIG. 17 presents the simulated versus measured photovoltaic power production on a half-hour basis for a one-year period for Sites A, B and C after applying the integrated weather and photovoltaic plant performance tuning and the operational plant status tuning, and then combining the results. The accuracy of the power generation forecast is notably improved. Table 1 provides a summary of error for half-hour results.

TABLE 1

| Method | Individual Site Average | Fleet of Three Sites | |
| --- | --- | --- | --- |
| | | Actual | Theoretical |
| Annual Power Calibration | 15.7% | 10.5% | 9.1% |
| Integrated Weather and Photovoltaic Plant Performance Tuning | 13.7% | 8.9% | 7.9% |
| Operational Plant Status Tuning | 8.9% | 6.2% | 5.1% |

The average half-hour MAE for each system is 8.9%. The theoretical photovoltaic fleet error is 5.1%. FIG. 18 illustrates that the actual photovoltaic fleet error is 6.2%, that is, the actual photovoltaic fleet error is approximately equal to the theoretical photovoltaic fleet error, which suggests that the tuning methodology, as described supra, can be used to set a target error and determine how many independent photovoltaic plants are required to reach the target.

While the invention has been particularly shown and described as referenced to the embodiments thereof, those skilled in the art will understand that the foregoing and other changes in form and detail may be made therein without departing from the spirit and scope.

What is claimed is:

1. A method for tuning a photovoltaic power generation forecast with the aid of a digital computer, comprising the steps of:
regularly measuring over an observation period with an irradiance sensor a time series of solar irradiance values for a physical location at which a photovoltaic power generation plant comprised in a power grid is situated, the power grid further comprising a plurality of power generators other than the photovoltaic power generation plant, a transmission infrastructure, and a power distribution infrastructure for distributing power from the photovoltaic power generation plant and the power generators to consumers;
regularly obtaining ambient temperature for the physical location; and
centrally operating with a digital computer the photovoltaic power generation plant comprising the steps of:
regularly providing to the computer the time series of solar irradiance values from the irradiance sensor and the ambient temperature;
providing to the computer the photovoltaic array configuration of the photovoltaic power generation plant, and global horizontal irradiance, global horizontal irradiance clear sky indexes, wind speeds, cloud data, and alternating current outputs of the photovoltaic power generation plant as measured over the observation period for the physical location;
simulating with the computer a time series of global horizontal irradiance over the observation period comprising each solar irradiance value as adjusted by the global horizontal irradiance clear sky index corresponding to the solar irradiance value;
simulating with the computer plane-of-array irradiance observations from the simulated global horizontal irradiance and the photovoltaic array configuration for the physical location over a forecast period;
identifying with the computer error between the measured and the simulated global horizontal irradiance over the observation period and developing an irradiance calibration function to minimize the identified error;
regularly adjusting with the computer each simulated plane-of-array irradiance observation by the irradiance calibration function based on the global horizontal irradiance clear sky index corresponding to the simulated plane-of-array irradiance observation;
simulating with the computer photovoltaic module temperatures for the photovoltaic generation plant over the forecast period based on the adjusted simulated plane-of-array irradiance observations and both the ambient temperatures and the wind speeds as measured over the observation period for the physical location;
forecasting with the computer power generation by the photovoltaic power generation plant over the forecast period based on the adjusted simulated plane-of-array irradiance, the simulated photovoltaic module temperatures, and the photovoltaic array configuration;
simulating with the computer power generation by the photovoltaic power generation plant over the observation period based on the adjusted simulated plane-of-array irradiance, the simulated photovoltaic module temperatures, and the photovoltaic array configuration;
identifying with the computer error between the measured alternating current outputs and the simulated power generation at each simulated input power level over the observation period and developing a power conversion efficiency curve function to minimize the identified error, comprising:
binning with the computer the measured alternating current outputs and the simulated power generation by simulated input power level; and
forming the power conversion efficiency curve function with the computer by minimizing error between and evaluating with the computer a ratio of the measured alternating current outputs to the simulated power generation at each simulated input power level;
quantifying with the computer average parasitic losses by the plant, comprising:
summing total nighttime power consumption over the forecast period; and
dividing the total nighttime power consumption by a total number of nighttime service hours; and
regularly adjusting with the computer the simulated power generation at each simulated input power level by the conversion efficiency curve function and by a value of the average parasitic losses that corresponds to each simulated input power level, wherein an amount of the power requested from one or more of the power generators and distributed from the one or more power generators using the transmission infrastructure and the distribution infrastructure to one or more of the customers is based on the adjusted simulated power generation.

2. A method according to claim 1, further comprising the steps of:
evaluating with the computer the irradiance adjustment function keyed on global horizontal irradiance clear sky indexes comprising normalized quantifications of sky clearness over the physical location;
regularly adjusting with the computer each simulated plane-of-array irradiance observation by the irradiance adjustment function that corresponds to the global horizontal irradiance clear sky index corresponding to the global horizontal irradiance used in generating the simulated plane-of-array irradiance observation.

3. A method according to claim 1, further comprising the steps of:
evaluating with the computer the power conversion efficiency curve function keyed on simulated input power level relative to measured alternating current outputs and the simulated power generation; and
regularly adjusting with the computer the simulated power generation by the power conversion efficiency curve function that corresponds to each input power level.

4. A method according to claim 1, further comprising the steps of:
evaluating with the computer a temperature correction function keyed simulated input power level relative to normalized measured alternating current outputs and the simulated photovoltaic module temperature; and
regularly adjusting with the computer the ambient temperature by the temperature correction function at each input power level.

5. A method according to claim 1, further comprising the steps of:
screening with the computer the global horizontal irradiance over the forecast period; and
removing with the computer the global horizontal irradiance corresponding to inaccurate power generation times or production.

6. A method according to claim 1, further comprising the steps of:
regularly adjusting with the computer the simulated power generation to match actual power generation over a recency window.

7. A non-transitory computer readable storage medium storing code for executing on a computer system to perform the method according to claim 1.

8. A method for tuning simulated plane-of-array irradiance for use in a photovoltaic power generation forecast with the aid of a digital computer, comprising the steps of:
regularly measuring over an observation period with an irradiance sensor a time series of solar irradiance values for a physical location at which a photovoltaic power generation plant comprised in a power grid is situated, the power grid further comprising a plurality of power generators other than the photovoltaic power generation plant, a transmission infrastructure, and a power distribution infrastructure for distributing power from the photovoltaic power generation plant and the power generators to consumers;
regularly obtaining ambient temperature for the physical location; and
centrally operating with a digital computer the photovoltaic power generation plant comprising the steps of:
regularly providing to the computer the time series of solar irradiance values from the irradiance sensor and the ambient temperature;
providing to the computer the photovoltaic array configuration of the photovoltaic power generation plant, and global horizontal irradiance, global horizontal irradiance clear sky indexes, and wind speeds as measured over the observation period for the physical location;
simulating with the computer a time series of global horizontal irradiance over the observation period comprising each solar irradiance value as adjusted by the global horizontal irradiance clear sky index corresponding to the solar irradiance value;
simulating with the computer plane-of-array irradiance observations from the simulated global horizontal irradiance and the photovoltaic array configuration for the physical location over a forecast period;
evaluating with the computer an irradiance adjustment function, comprising the steps of:
correlating with the computer the measured and the simulated global horizontal irradiance by respective times of measured and simulated observation over the observation period;
binning with the computer the measured and the simulated global horizontal irradiance as correlated along a continuum of the global horizontal irradiance clear sky indexes; and
forming the irradiance adjustment function with the computer by evaluating with the computer a ratio of and minimizing error between the measured global horizontal irradiance to the simulated global horizontal irradiance at each global horizontal irradiance clear sky index; and
regularly adjusting with the computer each simulated plane-of-array irradiance observation by the irradiance adjustment function based on the global horizontal irradiance clear sky index corresponding to the simulated plane-of-array irradiance observation;
simulating with the computer photovoltaic module temperatures for the photovoltaic generation plant over the forecast period based on the adjusted simulated plane-of-array irradiance observations and both the ambient temperatures and the wind speeds as measured over the observation period for the physical location;
quantifying with the computer average parasitic losses by the plant, comprising:
summing total nighttime power consumption over the forecast period; and
dividing the total nighttime power consumption by a total number of nighttime service hours; and
forecasting with the computer the power generation by the photovoltaic power generation plant over the forecast period based upon the adjusted simulated plane-of-array irradiance, the simulated photovoltaic module temperatures, a value of the average parasitic losses that corresponds to each simulated input power level, and the photovoltaic array configuration.

9. A method according to claim 8, further comprising the steps of:
identifying with the computer global horizontal irradiance clear sky at the physical based on a maximum amount of solar radiation at a horizontal surface; and
setting with the computer the global horizontal irradiance as the global horizontal irradiance clear sky adjusted by the global horizontal irradiance clear sky index that functionally corresponds to the global horizontal irradiance clear sky's value.

10. A method according to claim 8, further comprising the steps of:
quantifying with the computer the global horizontal sky clear sky indexes upon the type of data representing sky clearness,
wherein the sky clearness comprises at least one of terrestrially-measured cloud cover data, satellite-measured cloud index data, and probabilistically-generated cloud amount data.

11. A method according to claim 8, further comprising the steps of:
temporally with the computer screening the global horizontal irradiance over the forecast period; and
removing with the computer the global horizontal irradiance occurring during periods of insufficient irradiance.

12. A method according to claim 8, further comprising the steps of:
screening with the computer the global horizontal irradiance against performance data for the plant over the forecast period; and
removing with the computer the global horizontal irradiance corresponding to a mismatch between the simulated power generation and the global horizontal irradiance's value.

13. A non-transitory computer readable storage medium storing code for executing on a computer system to perform the method according to claim 8.

14. A method for tuning power generation performance for use in a photovoltaic power generation forecast with the aid of a digital computer, comprising the steps of:
regularly measuring over an observation period with an irradiance sensor a time series of solar irradiance values for a physical location at which a photovoltaic power generation plant comprised in a power grid is situated, the power grid further comprising a plurality of power generators other than the photovoltaic power generation plant, a transmission infrastructure, and a power distribution infrastructure for distributing power from the photovoltaic power generation plant and the power generators to consumers;
regularly obtaining ambient temperature for the physical location; and centrally operating with a digital computer the photovoltaic power generation plant comprising the steps of:

regularly providing to the computer the time series of solar irradiance values from the irradiance sensor and the ambient temperature;

providing to the computer the photovoltaic array configuration of the photovoltaic power generation plant, and global horizontal irradiance, global horizontal irradiance clear sky indexes, wind speeds, and alternating current outputs of the photovoltaic power generation plant as measured over the observation period for the physical location;

simulating with the computer a time series of global horizontal irradiance over the observation period comprising each solar irradiance value as adjusted by the global horizontal irradiance clear sky index corresponding to the solar irradiance value;

simulating with the computer plane-of-array irradiance observations from the simulated global horizontal irradiance and the photovoltaic array configuration for the physical location over a forecast period;

simulating with the computer photovoltaic module temperatures for the photovoltaic generation plant over the forecast period based on the simulated plane-of-array irradiance observations and both the ambient temperatures and the wind speeds as measured over the observation period for the physical location;

forecasting with the computer power generation by the photovoltaic power generation plant over the forecast period based on the simulated plane-of-array irradiance, the simulated photovoltaic module temperatures, and the photovoltaic array configuration;

evaluating with the computer a power conversion efficiency curve function, comprising the steps of:

simulating with the computer power generation by the photovoltaic power generation plant over the observation period based on the simulated plane-of-array irradiance, the simulated photovoltaic module temperatures, and the photovoltaic array configuration;

binning with the computer the measured alternating current outputs and the simulated power generation by simulated input power level; and forming the power conversion efficiency curve function with the computer by minimizing error between and evaluating with the computer a ratio of the measured alternating current outputs to the simulated power generation at each simulated input power level;

quantifying with the computer average parasitic losses by the plant, comprising:

summing total nighttime power consumption over the forecast period; and dividing the total nighttime power consumption by a total number of nighttime service hours; and regularly adjusting with the computer the forecast power generation by the power conversion efficiency curve function corresponding to each simulated input power level function and by a value of the average parasitic losses that corresponds to each simulated input power level.

15. A method according to claim 14, further comprising the steps of:

correcting for temperature with the computer, comprising the steps of:

normalizing with the computer the measured alternating current outputs to the simulated plane-of-array irradiance;

plotting with the computer the normalized measured alternating current outputs against the simulated photovoltaic module temperature; and determining with the computer a slope of the normalized measured alternative current outputs-to-simulated photovoltaic module temperature plot; and regularly adjusting with the computer the ambient temperature by the slope over at each input power level.

16. A method according to claim 14, further comprising the steps of:

determining with the computer actual power generation by the plant for a fixed recent period; and regularly adjusting with the computer the simulated power generation to match the actual power generation.

17. A method according to claim 14, further comprising the steps of:

screening with the computer the global horizontal irradiance against performance data for the plant over the forecast period; and removing with the computer the global horizontal irradiance corresponding to a mismatch between the simulated power generation and the global horizontal irradiance's value.

18. A non-transitory computer readable storage medium storing code for executing on a computer system to perform the method according to claim 14.

* * * * *